United States Patent
Remy

(10) Patent No.: US 7,164,803 B2
(45) Date of Patent: Jan. 16, 2007

(54) METHOD FOR ENCODING DIGITIZED IMAGES

(75) Inventor: Maurice Remy, Paris (FR)

(73) Assignee: Auteuil Participation et Conseil, Paris (FR)

( * ) Notice: Subject to any disclaimer, the term of this patent is extended or adjusted under 35 U.S.C. 154(b) by 732 days.

(21) Appl. No.: 10/221,049

(22) PCT Filed: Mar. 7, 2001

(86) PCT No.: PCT/FR01/00681

§ 371 (c)(1),
(2), (4) Date: Sep. 6, 2002

(87) PCT Pub. No.: WO01/67430

PCT Pub. Date: Sep. 13, 2001

(65) Prior Publication Data

US 2003/0081841 A1   May 1, 2003

(30) Foreign Application Priority Data

Mar. 9, 2000   (FR) .................................. 00 03020

(51) Int. Cl.
- G06K 9/36 (2006.01)
- G06K 9/00 (2006.01)
- G06K 9/46 (2006.01)

(52) U.S. Cl. ....................... 382/246; 382/162

(58) Field of Classification Search ................ 382/162, 382/165, 166, 232, 233, 240, 242, 243, 245, 382/247, 246; 348/468, 594, 607; 375/240.1, 375/240.11; 360/22; 370/336, 422; 235/472.01
See application file for complete search history.

(56) References Cited

U.S. PATENT DOCUMENTS

| | | | | |
|---|---|---|---|---|
| 5,384,665 A * | 1/1995 | Ohkuma et al. | ............... | 360/22 |
| 5,656,804 A * | 8/1997 | Barkan et al. | ......... | 235/472.01 |
| 5,889,564 A * | 3/1999 | Tsukagoshi | .................. | 348/594 |
| 6,097,558 A * | 8/2000 | Oguro | ........................ | 360/22 |
| 6,115,077 A * | 9/2000 | Tsukagoshi | .................. | 348/607 |
| 6,137,835 A * | 10/2000 | Yamashita et al. | .......... | 375/240 |
| 6,204,883 B1 * | 3/2001 | Tsukagoshi | ................. | 348/468 |
| 6,301,389 B1 * | 10/2001 | Penna et al. | ................. | 382/232 |
| 6,594,273 B1 * | 7/2003 | McGibney | .................. | 370/442 |
| 2003/0081841 A1 * | 5/2003 | Remy | ......................... | 382/232 |

* cited by examiner

Primary Examiner—Andrew W. Johns
Assistant Examiner—Amir Alavi
(74) Attorney, Agent, or Firm—Blakely Sokoloff Taylor & Zafman

(57) ABSTRACT

A method of encoding a digitised image including several pixel lines, which consists in encoding one line with a series of sub-codes characteristic of the length of the successive fields and their colour. When the image includes several identical successive lines, the method encodes the first one of the successive lines and completes with a sub-code characterising the repetition of the line and the number of times the line is repeated following the first line. When the image includes several lines including the same succession of colours, the method encodes the first one of the several lines including the same successive code and completes the code with a succession of sub-codes characterising the repetition of the succession of colours and the length of different fields of the different lines.

14 Claims, 1 Drawing Sheet

METHOD FOR ENCODING DIGITIZED IMAGES

This is a non-provisional application claiming the benefit of International application number PCT/FR01/00681 filed Mar. 7, 2001.

PRESENTATION OF THE GENERAL TECHNICAL DOMAIN AND OF THE STATE OF THE ART

The present invention relates to an image coding method.

It advantageously finds application in particular in respect of the coding of images of limited size (width and height of the order of or less than 400 pixels, for example), and more especially in respect of the coding and compression of simple images to be displayed on small-size screens (screens of portable telephones or of any other handheld terminal), such as advertising images comprising logos or alphanumeric characters with a particular design, or else stylized representations (commercial designs, images of the type of those known as "clipart").

It is in fact desired, in particular for the applications described in the applicant's French patent application filed under number FR-00.683, to be able to transmit and display images of the aforesaid type on screens of handheld terminals, such as portable telephones or pocket computers of the type of those marketed by the company 3COM under the name "Palm" or of the type of those using the Windows CE operating system and marketed by the companies CASIO and COMPAQ under the respective names "Cassiopeia" and "Aero".

An aim of the invention is therefore to propose a method for the coding and compression of images allowing high graphical fidelity, and in particular good rendition of the logos and of the design specific to advertisers and moreover allowing transmission using a limited number of bytes per image (400/500 useful bytes per image, for example).

Numerous coding and compression techniques are already known.

A coding and compression system which comes close to the expressed requirements is the "Bitmap Compuserve GIF" which is in particular used greatly on the Internet.

Reference may be made in this regard to U.S. Pat. No. 4,558,302 from Unisys Corporation "LZW (Lempel-Zev-Welch) compression and decompression methods".

This system codes the images with 2, 3, 4, 8 bits per pixel depending on the nature of the image.

However, its performance proves to be no better than a conventional statistical code and it is especially ineffective for simple images for which, given the level of rendition desired, it requires vector processing.

PRESENTATION OF THE INVENTION

The solution proposed by the invention, the performance of which proves to be markedly better, is a method for coding a digitized image comprising several lines of pixels, according to which method a line is coded by a succession of subcodes characteristic of the length of the successive fields and of their color, characterized in that when the image comprises several identical successive lines, the first of these lines is coded and this code is supplemented with a subcode characteristic of the repetition of the line and of the number of times that the line is repeated subsequent to this first line, when the image comprises several lines comprising the same succession of colors, the first of these lines is coded and this code is supplemented with a succession of subcodes which is characteristic of the repetition of the succession of colors and of the length of the various fields of the various lines.

Such a method is advantageously supplemented with the following various characteristics taken alone or according to all their possible combinations:

the code of a line which is not identical to the previous line or which does not comprise the same succession of colors comprises successively for each color field a subcode characteristic of the color of said field and a subcode characteristic of the length of the field;

a color is coded on fifteen values;

if the length of the field is less than 15 pixels, the field is coded on a byte XY, where X is the hexadecimal index number of the color and Y the length likewise in hexadecimal of the field and if the length of the field is greater than 15 pixels, the field is coded on two bytes X0, ZY where X is the index number of the color of the field and ZY the length of the field;

when the image comprises several identical successive lines, if the number of lines to be reproduced which are identical to the last line coded is less than 15, the repetition code is coded on one byte; and if this number is greater than 15, the repetition code is split into two bytes, one characteristic of the repetition function, the other which codes the number of lines to be reproduced;

when a line possesses the same structure of fields as the previous one, the length of its fields is coded in the following manner: if the length of a field is less than 15 pixels, its length is coded on a half-byte and, if the length of a field is greater than 15 pixels, its length is coded on three half-bytes 0, ZY where ZY is the length of the field;

a statistical compression processing is implemented on the coded image;

the images are of width and height dimensions of the order of or less than 400 pixels and are coded on a number of bytes of the order of or less than 500.

The invention also relates to a method characterized in that the coding method of the aforesaid type is implemented on a plurality of images and in that the images thus coded are broadcast in a loop to at least one handheld terminal which decodes the coded images which it receives so as to display them on its screen.

It relates furthermore to a system for broadcasting data in a loop comprising means for the radio broadcasting of data blocks in a given zone, a plurality of handheld terminals able to receive the data blocks thus radiobroadcast, processing means which manage the broadcasting of said data, characterized in that said processing means and said handheld terminals implement a method of the aforesaid type.

Other characteristics and advantages of the invention will become more apparent from the description which follows, which is purely illustrative and nonlimiting.

BRIEF DESCRIPTION OF THE DRAWING

Embodiments of the present invention will now be described, by way of example only, and with reference to FIG. 1, which represents a flow chart illustrating different steps of a method according to the invention.

DESCRIPTION OF AT LEAST ONE MODE OF IMPLEMENTATION OF THE INVENTION

Figure 1:
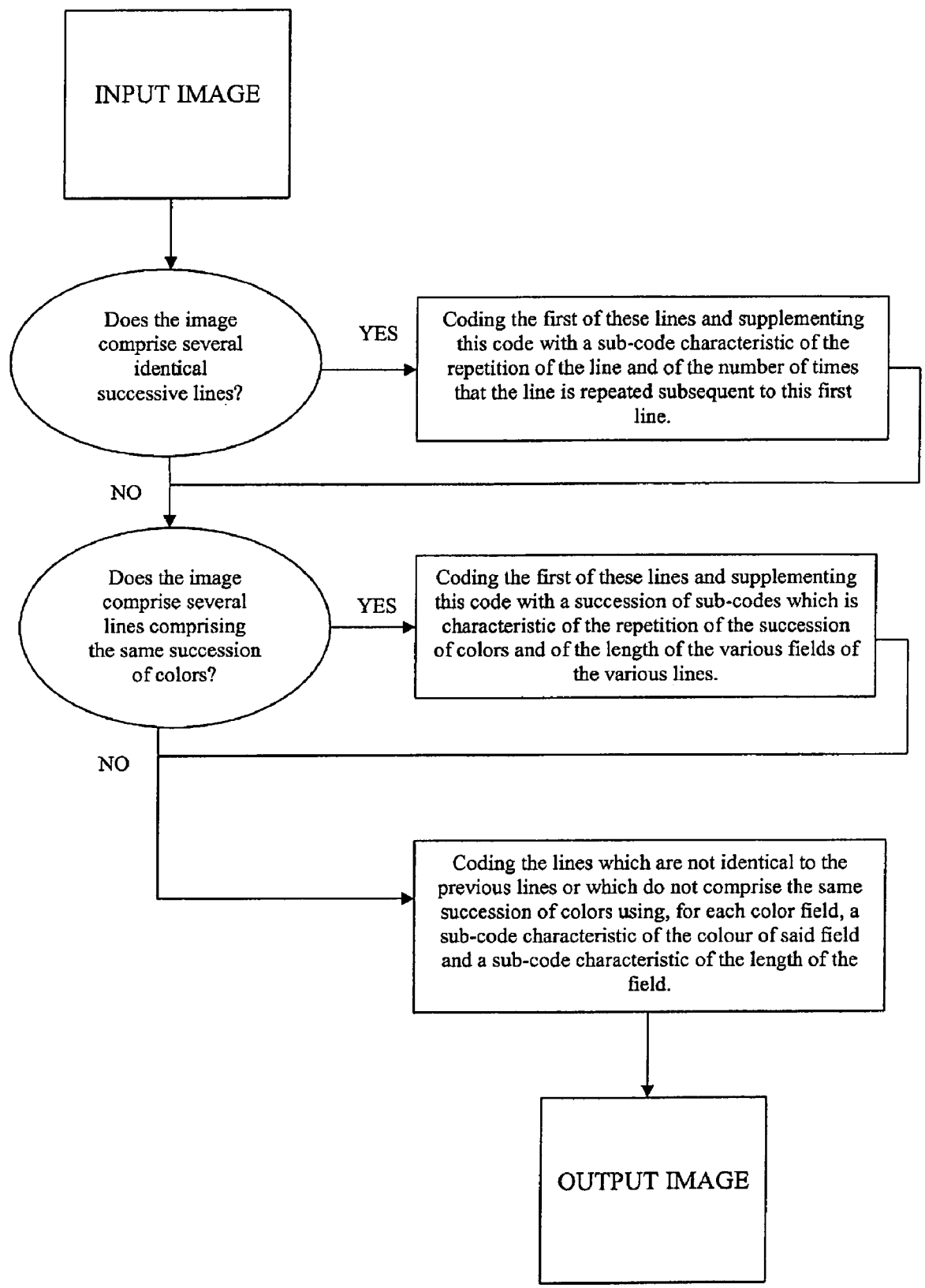

A first step of a possible mode of implementation of the invention consists of a preprocessing of the image which is aimed at eliminating the intermediate colors allocated to the pixels during the digitization of an analog image and limits the number of colors to be transmitted while improving the appearance of the image. It may be supplemented with manual touching-up limited to a few pixels.

A coding on the current lines of the image is implemented next, with the use of the correlation between successive lines to reduce the size of the code.

Lastly, a final statistical compression is implemented making it possible to utilize the statistical structure of the image.

Description of the Coding

The coding is carried out on fifteen colors.

The code used to describe an image comprises two parts, juxtaposed in the final file, that is to say after compression:
- the header describing the general characteristics of the coded image (type of statistical compression, size of the header, size of the image, color palette),
- the code of the image proper which makes it possible to reconstruct the color of each of the pixels, once the header is known.

The Header

The header comprises a variable number of bytes dependent on the number of colors comprising the image to be coded (maximum of 15).

More exactly, this number of bytes is equal to 3 times the number of colors to be coded plus four.

The assignment of the various bytes of the header is given by table 3.1, where $B_i$ denotes the ith byte.

TABLE 3.1

| Rank of the byte | Assignment | Field/meaning |
| --- | --- | --- |
| $B_0$ | Type of statistical compression and version | B0 = 80 + k (80 for version 1.0) (82, 83, 84, 88) |
| $B_1$ | Shifting data, rank of the first byte of the image code | (7–46) |
| $B_2$ | Width of the image (pixels) | (1–240) |
| $B_3$ | Height of the image (pixels) | (1–255) |
| $B_4$ to $B_6$ | RGB* of color 0 | (1–255) |
| $B_7$ to $B_9$ | RGB of color 1 | (1–255) |
| . | . | . |
| . | . | . |
| . | . | . |
| $B_{3N+1}$ to $B_{3(N+1)}$ | RGB of color N | (1–255) |
| . | . | . |
| . | . | . |
| . | . | . |

*R, G and B are the red, green and blue colorimetric coordinates of the color of the field which are coded on one byte according to the prevailing VGA, SVGA, XVGA and other computing standards.

Coding of the Image Proper

The coding of the image is performed line by line or by packets of identical lines commencing at the top left of the image and terminating at the bottom right.

Three types of coding are used for the lines depending on whether:
- the current line is identical to the previous one (coding of repetitive lines),
- the current line is similar to the previous one in that it comprises the same sequence of color fields, but with different field lengths (coding of lines of like structure),
- the current line is original in the sense that it does not belong to the above two categories (standard coding of a line).

The first line of an image is always coded in standard mode.

Standard Coding of a Line

The code gives successively for each color field of the line the color index number coded from 0 to 14 (the value 15 is reserved for the "flags" tagging certain functionalities) and the length of the field.
- if the length of the field is less than 15 pixels (same remark as hereinabove for the value 15), the field is coded XY hex. on one byte where X is the hexadecimal index number of the color and Y the length likewise in hexadecimal of the field ($X \leq E$, $1 \leq Y \leq E$), E representing the number 14 in hexadecimal (E hex.=14 dec.) likewise F hex.=15 dec.;
- if the length of the field is greater than 15 pixels, the field is coded on two bytes X0, ZY where X is the index number of the color of the field ($X \leq E$) and ZY the length of the field.

Coding of Repetitive Lines

When the coder has detected that a line is identical to the one preceding it, or that a series of lines is identical to the last line coded, it does not describe the fields of these lines and limits itself to sending a repetition code.
- if the number of lines to be reproduced which are identical to the last line coded is less than 15, the repetition code is one byte of the form FW where $W \leq E$ is the number of lines which are identical to the previous one that the decoder must reproduce, FW being the repetition code associated with W;
- if this number is greater than 15, the same escape procedure is used as for the coding of the fields; the repetition "flag" takes the form F0 followed by a byte which codes the number of lines to be reproduced TW ($01 \leq TW \leq FE$).

Coding of Lines of Like Structure

If a line possesses the same structure of fields as the previous one (same number, same colors in the same order), it is not necessary to transmit the colors again since the structure in the previous line can be copied.

The coding of a line of this nature is signaled by the FF "flag"; the lengths of fields are coded in the following manner:
- if the length of the field is less than 15 pixels, the field length is coded Y on a half-byte ($Y \leq E$),
- if the length of the field is greater than 15 pixels, the field is coded on three half-bytes 0, Z, Y where ZY is the length of the field.

The series of half-bytes is then reassembled into bytes with the possible addition of a padding half-byte at the end of the line if the coding leads to an odd number of half-bytes.

Statistical Compression

The codes corresponding to the various lines are assembled sequentially to give the code of the complete image.

However, this code does not take account of the statistics introduced by the structure of the image. The aim of the statistical compressor is to best utilize this distribution under conditions tailored to the limited size of the code.

Under the principle adopted the code distributes the bytes into two classes:
- the most frequent bytes which are encoded on 2, 3 or 4 bits preceded by a bit set to 0, i.e. words of 3, 4 and 5 bits respectively,
- the least frequent bytes are transmitted in full and preceded by a bit set to 1, i.e. 9 bits in total.

The choice to be made between the various compression solutions is made by the coder after having calculated the total size of the resulting code. The latter selects the most effective mode out of the four possible solutions. This choice is registered in the parameter k which can be accessed from the first byte of the header (table 3.2). A priori the statistical compression is not implemented for pre-compression image code sizes below an adjustable threshold (20 bytes as a typical value).

TABLE 3.2

| No statistical compression | K = 8 |
|---|---|
| Compression on 2 bits | K = 2 |
| Compression on 3 bits | K = 3 |
| Compression on 4 bits | K = 4 |

The first $2^k$ bytes of the compressed image code constitute the lookup table for the correspondence between the reduced code on k bits and the compressed bytes. The first byte being coded 0, the next 1, the last $2^k-1$ ([11], [111] or [1111] in binary).

The rest of the compressed image code is constructed as follows:

1) a series of words of k+1 or 9 bits is constructed, each representing one of the bytes of the code before compression according to the following rule:
- if the byte appears in the table of most frequent bytes with rank n, it is coded by the binary word formed by 0 followed by the k-bit binary expression for n (example the byte with rank 5 from the 0, 1 . . . 7 bytes of the table (k=3) is coded [0101],
- if the byte does not appear in this table, it is coded by the binary word formed by 1 followed by the unchanged binary code of the byte in question (example the byte 242 which does not appear in the table is coded [111110010]).

2) the series of thus-constructed words is then compacted into bytes. If the total length of the string of words is not a multiple of 8, a padding word is added to the end of the string to make the string up to a multiple of 8. This padding word consists of a one followed by as many zeros as necessary. Insofar as the total length of this word is less than or equal to 7 and insofar as it begins with a 1 which customarily signals a 9-bit word, it is easily recognized and eliminated by the decoder.

The final code is then assembled by stringing the following components together:

1) if k=8 (no statistical compression) stringing together of the header and of the uncompressed image code 2) if k=2, 3 or 4, stringing together of the header, of the sequence of the most frequent bytes and of the compressed image code.

Other Characteristics

In case of errors leading to the impossibility of decoding the image, the decoder returns a default image consisting of a rectangle with the dimensions of the image and in the "0" color, insofar as it is capable of reading the first few bytes of the header.

The method used also allows the production of transparencies ("inlay") by rendering the background of the image transparent. To produce a transparency, the coder allocates the transparent fields an immediately higher color index number than the last color described in the header. This leads to the number of colors actually available for the image being reduced to 14.

It will have been understood, the coding processing just described and the decoding processing are dissymmetric, the coding requiring more power than the decoding, this being especially relevant for the type of applications envisaged.

The decoding implemented by the means of processing of the handheld terminals is inverse to the coding processing and allows restoral of the image on a terminal equipped with the Windows CE software, for dimensions of images of the type of those indicated earlier (images of 255×255 pixels, for example, or 240×320 pixels).

The processing proposed allows not only the coding of images comprising logos or alphanumeric characters with a particular design, or stylized representations (commercial designs, images of type those known by the name "clipart").

In the case of more complex images, and in particular of images of photographic type, use will be made of conventional solutions ("JPEG" processing) with slicing of the image into strips whose coding requires fewer than 500 bytes.

The coding method proposed finds application advantageously in the case of images broadcast in a loop, if appropriate with other elements, to at least one handheld terminal which decodes the coded images which it receives so as to display them on its screen.

In particular, this coding method is advantageously implemented by the means of processing of a system for broadcasting data in a loop to handheld terminals.

Such a system is for example that which has been described in patent application FR-00.683.

It comprises in particular means for the radio broadcasting of data blocks in a given zone, a plurality of handheld terminals able to receive the data blocks thus radiobroadcast, processing means which manage the broadcasting of said data.

Said handheld terminals then carry a program which allows them to decode the coded images which it receives so as (if appropriate) to display them on its screen.

The invention claimed is:

1. A method comprising:
    coding a digitized image comprising several lines of pixels, where a line is coded by a succession of subcodes characteristic of the length of the successive fields and of their color,
    when the image comprises several identical successive lines, the first of these lines is coded and this code is supplemented with a subcode characteristic of the repetition of the line and of the number of times that the line is repeated subsequent to this first line,
    when the image comprises several lines comprising the same succession of colors, the first of these lines is coded and this code is supplemented with a succession of subcodes which is characteristic of the repetition of the succession of colors and of the length of the various fields of the various lines.

2. The method as claimed in claim 1, wherein the code of a line which is not identical to the previous line or which does not comprise the same succession of colors comprises successively for each color field a subcode characteristic of the color of said field and a subcode characteristic of the length of the field.

3. The method as claimed in claim 2, wherein
if the length of the field is less than 15 pixels, the field is coded on a byte XY, where X is the hexadecimal index number of the color and Y the length likewise in hexadecimal of the field,
if the length of the field is greater than 15 pixels, the field is coded on two bytes XO, ZY where X is the index number of the color of the field and ZY the length of the field.

4. The method as claimed in claim 1, wherein when the image comprises several identical successive lines,
if the number of lines to be reproduced which are identical to the last line coded is less than 15, the repetition code is coded on one byte;
if this number is greater than 15, the repetition code is split into two bytes, one characteristic of the repetition function, the other which codes the number of lines to be reproduced.

5. The method as claimed in claim 1, wherein when a line possesses the same structure of fields as the previous one, the length of its fields is coded in the following manner:
if the length of a field is less than 15 pixels, its length is coded on a half-byte,
if the length of a field is greater than 15 pixels, its length is coded on three half-bytes 0, ZY where ZY is the length of the field.

6. The method as claimed in any one of the preceding claims, wherein a color is coded on fifteen values.

7. The method as claimed in one of claims 1-2 or 3-5 wherein in that a statistical compression processing is implemented on the coded image.

8. The method as claimed in any one of claims 1-2 or 5-5, wherein the images are of width and height dimensions of the order of or less than 400 pixels and are coded on a number of bytes of the order of or less than 500.

9. A coding method characterized in that the coding method as claimed in one of claims 1-2 or 3-5 operates on a plurality of images which coded images are broadcast in a loop to at least one handheld terminal which decodes the coded images which it receives so as to display them on its screen.

10. A system for broadcasting data in a loop comprising:
means for radio broadcasting data blocks in a given zone,
a plurality of handheld terminals to receive the radio broadcasting data blocks as a radiobroadcast,
processing means to manage the radio broadcasting data blocks, said processing means and said plurality of handheld terminals including a coder that codes a digitized image comprising several lines of pixels, where a line is coded by succession of subcodes characteristic of the length of the successive fields and of their color,
wherein when the image comprises several identical successive lines, the first of these lines is coded by the coder and this code is supplemented with a subcode characteristic of the repetition of the line and of the number of times that the line is repeated subsequent to this first line, and
when the image comprises several lines comprising the same succession of colors, the first of these lines is coded by the coder and this code is supplemented with a succession of colors and of length of the various fields of the various lines.

11. The system as claimed in claim 10, wherein the code of a line which is not identical to the previous line of which does not comprise the same succession of colors comprises successively for each color field a subcode characteristic of the color of said field and a subcode characteristic of the length of the field.

12. The system as claimed in claim 11, wherein:
the field is coded by the coder on a byte XY, where X is the hexadecimal index number of the color and Y the length likewise in hexadecimal of the field if the length of the field is less than 15 pixels, and
the field is coded by the coder on two bytes XO, ZY where X is the index number of the color of the field and ZY the length of the field if the length of the field is greater than 15 pixels.

13. The system as claimed in claim 10, wherein when the image comprises several identical successive lines,
if the number of lines to be reproduced which are identical to the last line coded is less than 15, the repetition code is coded by the coder on one byte;
if this number of lines is greater than 15, the repetition code is split by the coder into two bytes, one characteristic of the repetition function, the other which codes the number of lines to be reproduced.

14. The system as claimed in claim 10, wherein when a line possesses the same structure of fields as the previous one, the length of its fields is coded by the coder in the following manner:
if the length of a field is less than 15 pixels, its length is coded by the coder on a half-byte,
if the length of a field is greater than 15 pixels, its length is coded by the coder on three half-bytes O, ZY where is the length of the field.

* * * * *